United States Patent [19]

Bachman

[11] 4,058,712
[45] Nov. 15, 1977

[54] ACRE COUNTER

[75] Inventor: Wesley J. Bachman, Mount Zion, Ill.

[73] Assignee: Dickey-john Corporation, Auburn, Ill.

[21] Appl. No.: 675,150

[22] Filed: Apr. 8, 1976

[51] Int. Cl.² .................... G06F 15/20; H03K 21/36
[52] U.S. Cl. .................................. 364/564; 33/123; 235/92 DN
[58] Field of Search ........ 235/151.3, 92 DN, 92 DM; 33/121-124

[56] References Cited

U.S. PATENT DOCUMENTS

| 3,264,739 | 8/1966 | Berlinsky et al. | 235/92 DN |
| 3,571,932 | 3/1971 | Peddie | 235/92 DN |
| 3,928,751 | 12/1975 | Fathauer | 235/92 DN |

Primary Examiner—Malcolm A. Morrison
Assistant Examiner—Errol A. Krass
Attorney, Agent, or Firm—Olson, Trexler, Wolters, Bushnell & Fosse, Ltd.

[57] ABSTRACT

A system for measuring the amount of area traversed by a vehicular implement comprising linear distance measuring means for generating an electrical signal having a characteristic which varies systematically in accordance with the distance traversed by the implement. An electronic switch having a first switching state and a second switching state is utilized for developing a control signal having a first value when the switch is in the first state and a second value when the switch is in the second state, with the electronic switch being coupled to the electrical signal generator and responsive to the electrical signal for switching to the first switching state. A clock is responsive to the control signal being in the first state and having the first value for generating a timing signal having a predetermined frequency. A pair of presettable dividers are coupled to the clock for developing a switching signal which is applied to the electronic switch to switch it to the second switching state. A counter is coupled to the clock for counting the total number of cycles of the timing signal during the period of time that the electronic switch is in the first switching state and developing a corresponding area signal. A visual display is responsive to the area signal for visually displaying to the operator the value of the area signal so that the operator can quickly see the total area covered by the implement during a given period of time.

19 Claims, 4 Drawing Figures

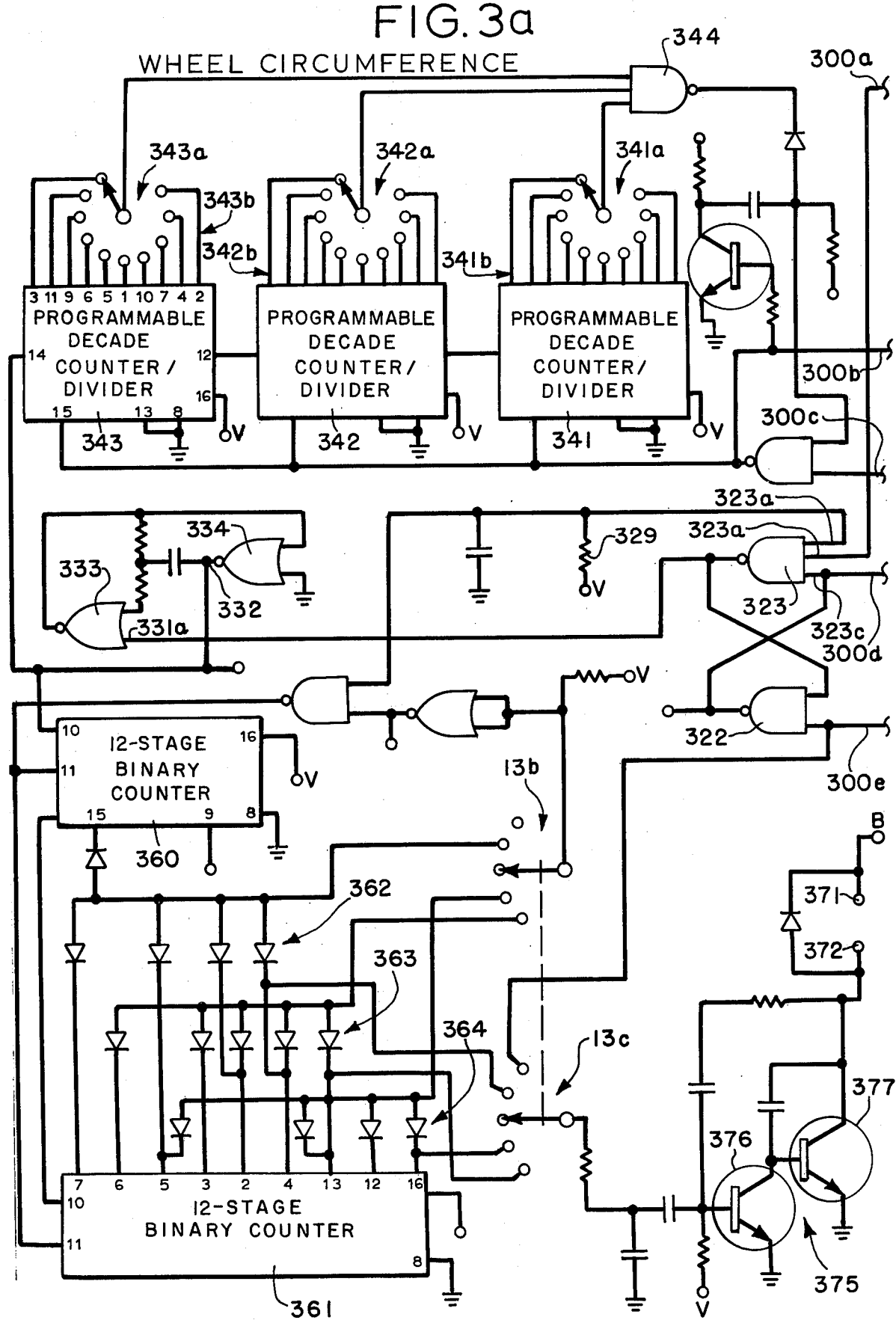

IMPLEMENT WIDTH

ACRE COUNTER

BACKGROUND OF THE INVENTION

This invention relates generally to a system for measuring the amount of area traversed by a vehicular implement and, more particularly, it relates to an electronic system for measuring the amount of area traversed by a tractor-drawn farm implement such as a seed planter, sprayer, or cultivating implement.

There are a number of applications where a vehicular implement is used to treat an area of ground and it is desirable for the operator of the implement to be able to conveniently and quickly determine the area of ground treated. For example, a farmer often pulls a vehicular planting implement behind his tractor which mechanically and systematically plants seeds in the ground. Such a planter has a seed dispenser of a given width from which the seeds are typically planted in a plurality of parallel rows in the ground. The area covered by such an implement thus depends upon not only the distance traveled by the implement but also the width of the seed dispenser. Other implements, such as liquid sprayers and cultivators, also operate on an area which is determined by both the distance traversed and the implement width and in each of these situations, it is desirable for the farmer to know at any given time how much acreage he has covered so that he may control, for example, the seed population, density of liquid sprayed, or the like.

Conventional means for obtaining such information are often not as well suited for the application desired or as accurate as the operator may wish. For example, the operator may use the reading given by his odometer on the tractor and then, through a series of measurements and computations, arrive at a rough figure as to the area covered. Such a system is not particularly accurate (conventional odometers typically are no better than 95% accurate) nor is it especially convenient to a farmer out in the field.

Moreover, conventional acreage measurement systems are sometimes not as flexible as may be desired in terms of permitting the operator to transfer the system from one tractor or implement to another. To be so flexible, of course, requires that the system be adjustable to take into account the various implement widths customarily found in farm implements. Moreover, since distance and acreage counting devices often employ mechanical means driven by the front wheel of the tractor or vehicular implement, the counter should be adaptable for use with different circumference driving wheels.

It is therefore an object of this invention to provide a new and improved system for measuring the amount of area traversed by a vehicular implement.

It is another object of the invention to provide such a system which is efficient and simple to operate.

It is a specific object of the invention to provide such a system which is easily adaptable to implements of various widths and for accommodating wheel-actuated distance sensors having different driving wheel circumferences.

SUMMARY OF THE INVENTION

In accordance with the invention, a new and improved system for measuring the amount of area traversed by a vehicular implement comprises linear distance measuring means for generating an electrical signal having a characteristic which varies systematically in accordance with the distance traversed by the implement. Electronic switch means having a first switching state and a second switching state for developing a control signal having a first value when the switch means is in the first state and a second value when the switch means is in the second state, with the electronic switching means being coupled to the electrical signal generating means and responsive to the electrical signal for switching to the first switching state. A clock is employed which is responsive to the control signal having the first value for generating a timing signal having a predetermined frequency. Also utilized is a first presettable divider coupled to the clock for counting a preset number of cycles of the timing signal and developing an output signal having a frequency corresponding to the number of times the divider counts the preset number of cycles. A second presettable divider is coupled to the first presettable divider for counting the frequency of the output signal and developing a switching signal which is applied to the electronic switch means to switch it to the second switching state. A counter is coupled to the clock for counting the total number of cycles of the timing signal during the period of time that the electronic switch means is in the first switching state and developing a corresponding area signal. Also provided are means responsive to the area signal for visually displaying the value of the area signal, whereby the total area covered by the implement during a given period of time is visually displayed.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings in the several figures of which like reference numerals identify like elements, and in which:

FIGS. 3a and 3b are schematic diagrams of a preferred embodiment of the invention.

DESCRIPTION OF THE PREFERRED EMBODIMENT

Figure 1:
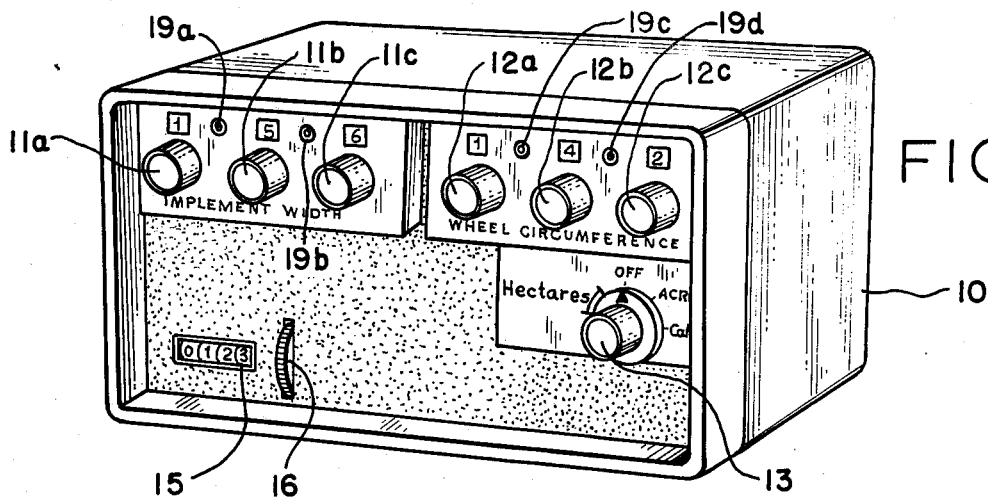
FIG. 1 is a perspective view of a control console for the system of the present invention.

With reference to FIG. 1, there is shown a perspective view of the control console 10 of the present invention. Console 10 contains essentially all of the electronic circuitry for the system and is mounted within easy reach of the operator. For a farm implement, for example, console 10 is typically mounted on the tractor although it of course may be mounted on the implement itself, particularly in the case of a self-propelled implement such as a combine or grain harvester. Connected to the console is a wheel-driven distance sensor (not shown in FIG. 1) which is typically mounted on one of the front wheels of the tractor. Mounting such a sensor on the front wheel of course avoids some of the problems due to wheel slippage associated with the rear driving wheels of the tractor.

Console 10 enables the operator to adjust the system in accordance with both the implement width, by means of selector switches 11a, 11b, and 11c, and the circumference of the distance-sensing driving wheel, by means of selector switches 12a, 12b, and 12c. As illustrated in FIG. 1, the console is adjusted for an implement width of 15.6 feet and a driving wheel circumference of 14.2 feet, although the illustrated system of the invention may be adjusted to accomodate implement widths up to 99.9 feet or meters and driving wheel circumference of up to 99.9 feet or meters. A selector switch 13 enables the operator to select between a readout of different predetermined units of area measurement (e.g., acreage or hectarage), or place the counter in an "off" mode when, for example, the implement is traversing a road or some other such area on which the implement is not to be used. A digital readout 15 shows the operator at a glance the cummulative or updated amount of area covered at any given time. A thumb wheel control 16 is provided to enable the operator to reset the display (here being an electromechanical counter readout) to zero when beginning a new operation. Indicator lights 19a, 19b, 19c and 19d are selectively illuminated when the system is energized by the power supply, (i.e., switch 13 is in a position other than "OFF" and the system is connected to the power supply), which typically comprises the vehicular electrical system (e.g., a 12-volt storage battery charged by an alternator) but which may further include a voltage regulator circuit to both reduce the voltage to a level suitable for the electronic circuitry (e.g., 8 volts) and to stabilize it to a greater degree than that of the vehicle's supply. Indicator lights 19a, 19b, 19c and 19d also function a decimal point indicator as determined by the position of switch 13.

Figure 2:
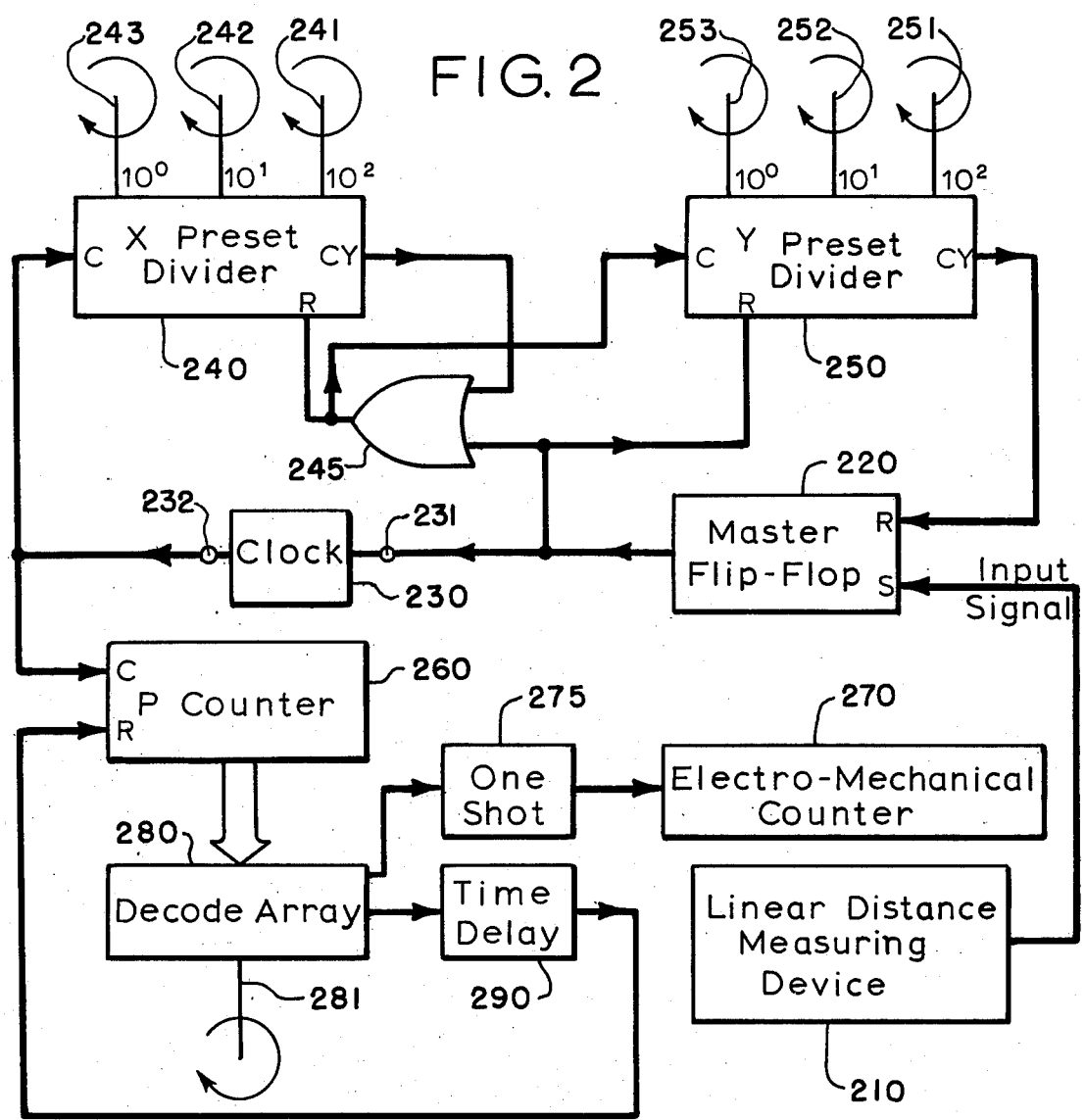
FIG. 2 is a block diagram of a preferred embodiment of the invention.

With respect to FIG. 2, there is shown a block diagram of the circuitry of the system of the invention for measuring the amount of area traversed by a vehicular implement. In general, the system comprises linear distance measuring means 210 for generating an electrical signal having a characteristic which varies systematically in accordance with the distance traversed by the implement (not shown). Device 210 may take the form of any suitable conventional device which generates an electrical signal having a characteristic which varies systematically in accordance with the distance traversed by the implement. One such device is a slotted disc positioned between a light sensor and light source and rotatably driven by a wheel which contacts the ground over which the implement is moving. The light sensor (e.g. a phototransistor) receives the bursts of light through the slots in the rotating disc and converts them to a predetermined number of pulses for each wheel revolution. Hence, each pulse represents a given linear distance traversed by the implement. Since these elements do not comprise part of the present invention, they are not illustrated in detail. Other devices providing an electrical signal which has a suitable characteristic may of course be employed without departing from the principles of the present invention.

Electronic switch means in the form of a master flip-flop 220 having a first or "set" switching state and a second or "reset" switching state, are provided for developing a control signal having a first value (e.g., "low" or "0") when flip-flop 220 is in the "set" state and a second value (e.g., "high" or "1") when flip-flop 220 is in the "reset" state. Flip-flop 220 is coupled to linear distance measuring device 210 and is responsive to the electrical distance signal therefrom being applied to the set terminal "S" of flip-flop 220 for switching flip-flop 220 to the set state. Flip-flop 220 is switched to its second or "reset" switching state by the signal applied to the reset terminal "R" of flip-flop 220, as hereinafter described in greater detail.

The control signal from flip-flop 220 is applied to an inhibit terminal 231 of a clock 230. Clock 230 may comprise any conventional circuit for generating a timing signal having a predetermined frequency. In the illustrated embodiment of the invention, clock 230 produces a pulse train signal having a frequency of 350 kilohertz. When the control signal from flip-flop 220 is high, the clock is enabled and generates the 350 kilohertz timing signal. On the other hand, when the control signal from flip-flop 220 is low, clock 230 is inhibited and does not produce the timing signal.

The timing signal from clock 230 is applied to a first presettable divided in the form of X preset divider 240 which counts a preset number of cycles of the timing signal from clock 230 and develops an output signal having a frequency which corresponds a number of times that the divider 240 counts the preset number of cycles. In other words, divider 240 produces one output pulse for every N number of input clock pulses at terminal "C", N being the number of cycles set by three selectors 241, 242, and 243, which corresponds respectively to wheel circumference selector switches 12a, 2b, and 12c of control console 10 of FIG. 1. In the embodiment of the invention illustrated in FIG. 2, X preset divider 240 is a three-stage decade divider which is used to adjust the system in accordance with the circumference of the driving wheel which is used to actuate linear distance measuring device 210. The output of divider 240 is available at the terminal designated "CY" and is coupled to the input of a second presettable divider in the form of Y preset divider 250 by means of an OR gate 245, as described in greater detail hereinbelow.

Y preset divider 250 is quite similar to X preset divider 240 in that it is a three-stage decade divider which is set by three controls 251, 252, and 253, which correspond respectively to implement width selector switches 11a, 11b, and 11c of control console 10 of FIG. 1. Y preset divider 250 develops an output switching signal whenever it counts the predetermined number of cycles in the output signal of divider 240. This output signal is applied to reset terminal R of flip-flop 220 to switch flip-flop 220 to the reset stage, which causes the control signal to go to a low value to thus inhibit clock 230 from generating any further timing signal cycles.

Thus, for example, if preset divider 240 is set so that it divides a timing signal from clock 230 to produce one output pulse for every 123 timing signal cycles, and preset divider 250 is set to produce one output pulse for every 100 output pulses from divider 240, the result is that flip-flop 220 enables clock 230 to generate a timing signal having 123,000 pulse cycles (123 × 100).

By simultaneously applying the timing signal of clock 230 to a P counter 260, the identical count (i.e., 123,000) is counted and may be directly displayed by an electromechanical counter 270 or, where desired and in accordance with another aspect of the invention, decoding circuitry may be utilized between counter 260 and electromechanical counter 270 to convert the number of cycles counted to a desired unit of square measure (e.g., acres, hectars, or even an arbitrary unit such as "patches"). The decoding circuitry in the embodiment of the invention shown in FIG. 2 comprises a decode array 280, which may be adjusted by control 281 to enable the operator to select different units of area measure, and a time delay circuit 290 which permit sufficient delay to allow for resetting of the counter 260.

The reset function occurs in less than one clock cycle to allow any remaining partial product to be stored for the following area count.

Electromechanical counter 270 is driven by a monostable multivibrator or one-shot circuit 275 which is responsive to the area signal from P counter 260 (via decode array 280) for visually displaying the value of the area signal. Electromechanical counter 270 and one-shot circuit 275 may of course be of any conventional construction suitable for this purpose.

The OR gate 245 is employed in the embodiment of the invention illustrated in FIG. 2 to provide a reset signal to reset terminal R of divider 240 whenever either the output of divider 240 goes high (i.e., at the end of a dividing cycle by divider 240) or that of master flip-flop control signal 220 goes high (i.e., at the end of a dividing cycle by divider 250), to insure that divider 240 starts at zero each time it begins a new cycle. The control signal from master flip-flop 220 is also applied to the reset terminal R of divider 250 to likewise cause divider 250 to begin counting at zero each time the control signal from flip-flop 220 is high (i.e., when the output signal from divider 250 is applied to the reset terminal master flip-flop 22).

Thus, it may be seen generally how the invention provides a system for measuring the amount of area traversed by a vehicular implement. The system is flexible to permit convenient adjustment for variations in both the circumference of the distance measuring wheel and the width of the implement. A description of the electrical circuit of a specific embodiment of the invention is presented immediately below.

Figure 3B:
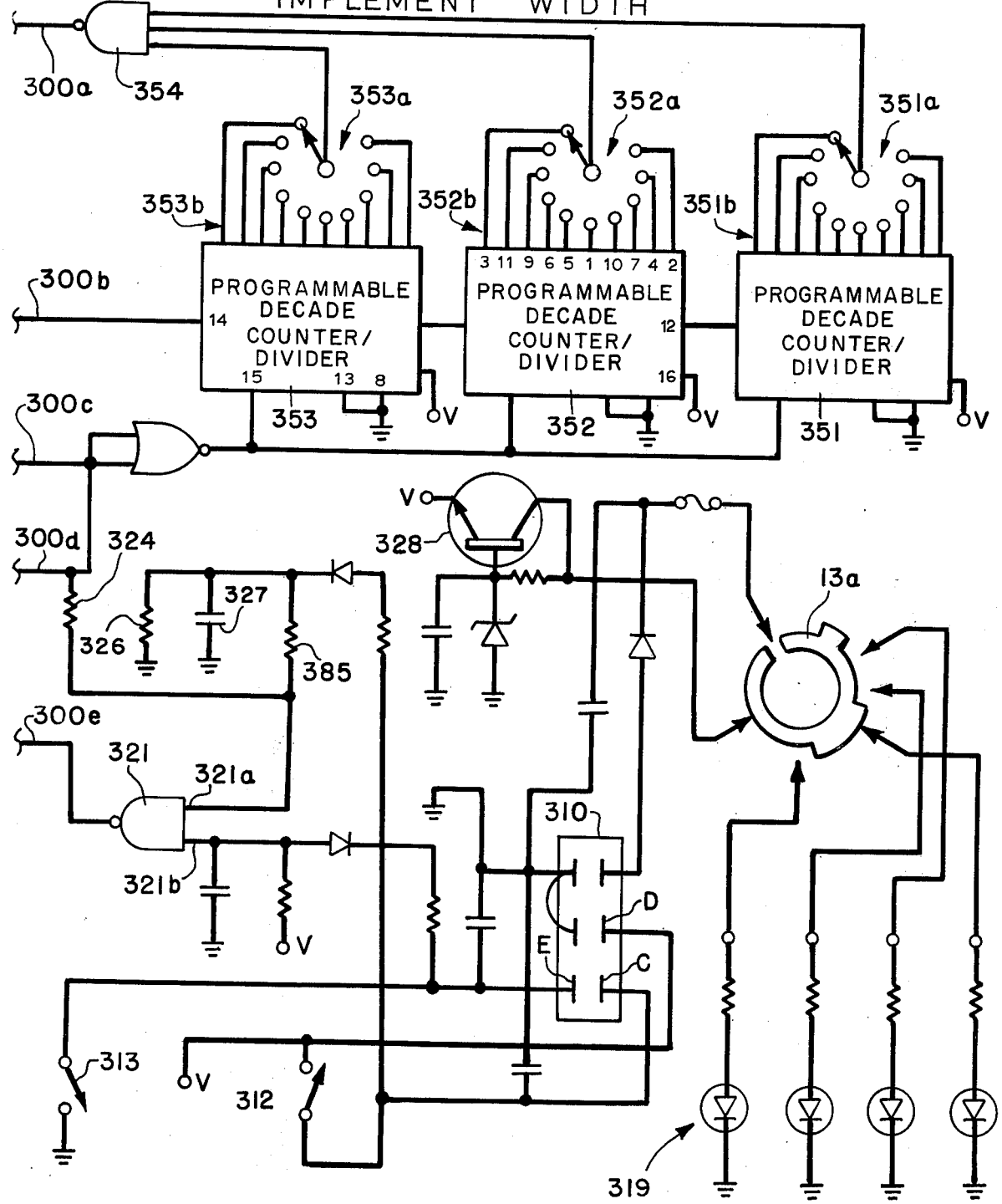

FIGS. 3a and 3b illustrate an electrical schematic circuit diagram of a system for measuring the amount of area traversed by a vehicular implement constructed in accordance with the present invention. For greater legibility and to facilitate a better understanding of the illustrated embodiment of the invention, the circuit has been divided approximately in half with one half illustrated in FIG. 3a and the other half shown in FIG. 3b. Reference characters 300a, 300b, 300c, 300d, and 300e on FIGS. 3a and 3b represent where the portion of the circuit of FIG. 3a is connected to the portion of the circuit of FIG. 3b.

The electronic switch means of the specific embodiment of the invention illustrated in FIGS. 3a and 3b comprises three NAND gates 321, 322, and 323. NAND gate 321 receives the input signal at input terminal 321a from the distance sensor which in the illustrated embodiment of the invention is in the form of a switch 312 which is closed in response to a camming mechanism (not shown), for example, which is driven by the front wheel of the tractor. Closing switch 312 couples voltage V to input terminal 321a. Of course any other device suitable for applying distance pulses to terminal 321a may be utilized. NAND gate 321 has a second input terminal 321b which is coupled to disable switch 313 to inhibit the system when the implement is not operating such as when crossing a road or making a turn around at the end of a field. Switch 313 may be a rotary actuated switch operatively connected to the implement to automatically inhibit the system when the implement is not operating (e.g. lifted off the ground to at least a predetermined angle such as 15° relative to the horizontal). A plug 311 may be utilized to conveniently connect the system to external inhibit switches, input signals and the power supply. Switch element 13a selectively couples indicator lights in the form of four light-emitting diodes 319 (which correspond to lights 19a, 19b, 19c and 19d of FIG. 1) to indicate the proper location of the decimal point in the digital readout and that the system is energized. NAND gates 322 and 323 are cross-coupled to form a flip-flop circuit in the conventional manner. NAND gate 322 has two input terminals, one coupled to the output terminal of NAND gate 321 and the other coupled to the output terminal of NAND gate 323. NAND gate 323 has three input terminals, 323a, 323b, and 323c. Input terminal 323a is coupled to voltage source V by means of resistor 329 and input terminal 323b receives the reset signal from NAND gate 354, as hereinafter discussed in greater detail. Input terminal 323c is coupled to the output terminal of NAND gate 322 and resistors 324 and 325 operate in conjunction with NAND gate 321 to form a regenerative loop to which the incoming signal is applied in order to provide suitable wave shaping. Resistor 326 and capacitor 327 perform as a switch debouncing circuit for those applications of the invention in which a mechanical switch, for example, is used to give the input distance signal. A similar circuit is provided for input terminal 321b of NAND gate 321 for the inhibit signals.

The clock circuit of the illustrated embodiment of the invention comprises two NOR gates 333 and 334 which oscillate at a frequency of 350 kilohertz as long as the proper enabling signal from NAND gate 323 is applied to input terminal 333a of NOR gate 333c, otherwise, the clock circuit is inhibited and does not generate the 350 kilohertz timing signal. The output of the clock circuit is obtained at the output terminal 332 of NOR gate 334 and is applied to the clock input of the first programmable decade counter/divider stage 343 of the three-stage preset divider comprising three series-connected programmable decade counter/dividers 341, 342, 343, each of which may comprise an integrated circuit commonly known as a divide-by-10 counter/divider, such as integrated circuit "CD4017" manufactured by National Semiconductor Corporation. The pin connections for each integrated circuit are marked on the block representing the circuit next to the associated electrical connection. Corresponding selector switches 341a, 342a, and 343a are respectively coupled to the decoded output terminals 341b, 342b, and 343b of programmable decade counter/dividers 341, 342, and 343 to enable the system to be programmed such that a preset number of cycles or pulses from the clock circuit are required before a three-input NAND gate 344 produces an output signal. For example, unless all three inputs to NAND gate 344 are high, the output will also be high. Thus, when a sufficient number of pulses have been applied to the three-stage counter/divider to satisfy the decoded value set by the associated selector switch for each divider, a high will be applied to each of the three input terminals of NAND gate 344 which results in a low output signal from NAND gate 344. If the switches are set to the number 123, representing a wheel circumference of 12.3 feet, the total number of clock pulses entering the three-stage divider is 123 before NAND gate 344 output goes low. The most significant digit (i.e., "1") is obtained by inputting 100 pulses into counter/divider stage 343. 100 Pulses into counter/divider stage 343 results in 10 pulses into stage 342, and, thus, one pulse at the selected decoded output terminal of third stage 341. To obtain the next most significant digit (i.e., "2"), 20 pulses are required into first stage 343. Finally, to obtain a high output on the terminal corresponding to the number three for the least most significant digit stage, three pulses must be inputted to first stage 343. Thus, it can be seen that when the three switches 341a, 342a, and 343a are set to the number 123, it takes 123 pulses from the clock circuit to obtain a low output signal from NAND gate 344. This output signal is applied to NAND gate 345 which in turn resets counter/dividers 341, 342, and 343 and simultaneously applies a pulse to the input terminal of the first stage 351 of the implement width resettable divider.

Similar to the wheel circumference divider, the implement width divider comprises three programmable decade dividers 351, 352, and 353. The three-stage divider is programmed by selector switches 3351a, 352a, and 353a coupled to the decoded output terminals 351b, 352b, and 353b, and the switch outputs are applied to a three-input NAND gate 354, the output of which is applied to terminal 323b of NAND gate 323 of the master flip-flop circuit to reset it. Thus, the implement width is preset in the same fashion as the wheel circumference and the two setting are in effect multiplied together to obtain a total count for each distance signal input pulse.

This count is obtained by simultaneously applying the timing signal from terminal 332 of NOR gate 334 to a "P" or product counter in the form of a pair of 12-stage binary ripple counters 360 and 362. Counters 360 and 361 may be of any suitable conventional construction; however, an integrated circuit manufactured by National Semiconductor Corporation, for example, and commonly known as "CD 4040" has been found especially well adapted for this purpose. Two binary counters 360, 361 and three diode arrays 362, 363, and 364 along with two additional switch selections 13b, 13c of switch 13 of FIG. 1 are utilized so that the system can readout two different measures of area such as, for example, acres and hectars. Switch sections 13b and 13c of switch 13 of FIG. 1 are employed to enable the operator of the system to select the unit of measure desired. Of course additional stages and switch positions may be employed where desired to obtain additional units of measure without departing from the principles of the invention. For example, a "CAL" position enables the operator to calibrate the system for the particular distance sensor used. The operator merely selects "CAL" with switch 13, which causes the system to read out the number of input distance pulses, and drives until 10 pulses are indicated. He then measures the distance traveled to obtain the distance represented by each pulse.

The parallel outputs of counters 360 and 361 are decoded by three diode arrays 362, 363, and 364, the values of which correspond to the square unit per area number. These arrays are switch-selected by the operator to yield an output in the unit of measure of his choice. It should be noted that the diode decode arrays alone control the unit of square measure; that is, if it were desired to measure in some arbitrary unit of area such as "patches", the addition of only one more diode array having a value of n square units of measure per "patch" would be required. Moreover, since a sum of various binary members can be made equal to any decimal number, the diode arrays can be made exact. In practice, relatively few diodes are required to generate accuracies of better than 0.1 percent. In addition, the numbers entered into the wheel circumference and implement width programmable dividers in the embodiment of the invention illustrated in FIGS. 3a and 3b generate partial products of 100 times their per unit square values. This situation is readily handled by increasing the decoded length of the counter by a factor of 100.

The output of the binary counter is coupled to a one-shot circuit 375 by switch element 13c. One-shot 375 comprises two switching transistors 376 and 377 and the associated biasing and timing circuitry to drive an electromechanical counter (not shown) which is coupled to terminals 371 and 372, to visually display the area measured. The electromechanical counter may be powered by the vehicle's battery voltage represented by "B".

Thus the invention provides a new and improved system for measuring the amount of area traversed by a vehicular implement. The device of the invention is relatively simple to operate and is easily adaptable to implements of various widths and wheel-driven distance measuring devices having wheels of various circumferences.

While a particular embodiment of the invention has been shown and described, it will be obvious to those skilled in the art that changes and modifications may be made without departing from the invention in its broader aspects and, therefore, the aim of the appended claims is to cover all such changes and modifications as fall within the true spirit and scope of the invention.

The invention is claimed as follows:

1. A system for measuring the amount of area traversed by a vehicular implement comprising: linear distance measuring means for generating an electrical signal having a characteristic which varies in accordance with the distance traversed by said implement; electronic switch having a first switching state and a second switching state for developing a control signal having a first value when aid switch means is in said first state and a second value when said switch means is in said second state, said electronic switch means being coupled to said electrical signal generating means and responsive to said electrical signal for switching to said first switching state; clock means responsive to said control signal having said first value for generating a timing signal having a predetermined frequency; a first presettable divider coupled to said clock means for counting a preset number of cycles of said timing signal and developing an output signal having a frequency corresponding to the number of times said divider counts said preset number of cycles; a second presettable divider coupled to said first presettable divider for counting said preset number of cycles of said output signal and developing a switching signal which is applied to said electronic switch means to switch it to said second switching state; counter means coupled to said clock means for counting the total number of cycles of said timing signal during the period of time that said electronic switch means is in said first switching state and developing a corresponding area signal; and display means responsive to said area signal for visually displaying the value of said area signal, whereby the total area covered by the implement during a given period of time is visually displayed.

2. A system in accordance with claim 1, in which said electronic switch means comprises a master flip-flop including a three-input NAND gate and a two-input NAND gate, whereby said first switching state corresponds to the set state of said flip-flop and the said second switching state corresponds to the reset state of said flip-flop.

3. A system in accordance with claim 1, which further comprises inhibit means coupled between said electronic switch means and said signal generating means for interrupting the application of said electrical signal to said electronic switch means, whereby the area measuring system may be temporarily interrupted while the implement is traversing area which the operator does not wish to include in this measurement.

4. A system in accordance with claim 1, in which said first presettable divider comprises a plurality of series-connected decade dividers each having a plurality of decoded output terminals and a NAND gate having a plurality of input terminals corresponding to said plurality of series-connected decade dividers, with a corresponding plurality of selector switches respectively coupled between said decoded output terminals of said decade dividers and said NAND gate for selectively coupling one of said decoded output terminals of each divider to an input of said NAND gate, whereby the first presettable divider may be set to adjust the system to accommodate various distance signal generating means.

5. A system in accordance with claim 1, in which said second presettable divider comprises a plurality of series-connected decade dividers each having a plurality of decoded output terminals, and a NAND gate having a plurality of input terminals corresponding to said plurality of series-connected decade dividers, with a corresponding plurality of selector switches respectively coupled between said decoded output terminals of said decade dividers and said NAND gate for selectively coupling one of said decoded output terminals of each divider to a input of said NAND gate, whereby the second presettable divider may be set to adjust the system to accommodate various implement widths.

6. A system in accordance with claim 1, in which said electronic switch means comprises a flip-flop circuit including two cross-coupled NAND gates.

7. A system in accordance with claim 1, in which said display means comprises an electromechanical counter responsive to said area signal for visually displaying a decimal number corresponding to the area measured by said system.

8. A system in accordance with claim 1, which further comprises decoder means coupled between said counter means and said display means for converting said area signal into a signal corresponding to a predetermined unit of area measurement.

9. A system in accordance with claim 8, in which said decoder means comprises a plurality of binary counters each having a plurality of parallel decoder output terminals, a diode array coupled to said decoder output terminals for developing a plurality of decoded signals each corresponding to a different predetermined unit of area measurement, and a selector switch coupled between said diode array and said display means, whereby the different units of area measurement may be selectively displayed by the display means.

10. A system for measuring the amount of area traversed by a vehicular implement comprising: linear distance measuring means for generating an electrical signal having a characteristic which varies in accordance with the distance traversed by said implement; electronic switch means having a first switching state and a second switching state for developing a control signal having a first value when said switch means is in said first state and a second value when said switch means is in said second state, said electronic switch means being coupled to said electrical signal generating means and responsive to said electrical signal for switching to said first switching state; clock means responsive to said control signal having said first value for generating a timing signal having a predetermined frequency; presettable divider means coupld to said clock means for counting a predetermined number of cycles of said timing signal and developing a switching signal which is applied to said electronic switch means to switch it to said second switching state; counter means coupled to said clock means for counting the total number of cycles of said timing signal during the period of time that said electronic switch means is in said first switching state and developing a corresponding area signal; and display means responsive to said area signal for visually displaying the value of said area signal, whereby the total area covered by the implement during a given period of time is visually displayed.

11. A system in accordance with claim 10, in which said electronic switch means comprises a master flip-flop including a three-input NAND gate and a two-input NAND gate, whereby said first switching state corresponds to the set state of said flip-flop and the second switching state corresponds to the reset state of said flip-flop.

12. A system in accordance with claim 10, which further comprises inhibit means coupled between said electronic switch means and said signal generating means for interrupting the application of said electrical signal to said electronic switch means, whereby the area measuring system may be temporarily interrupted while the implement is traversing area which the operator does not wish to include in his measurement.

13. A system in accordance with claim 12, which further comprises inhibit switch means mechanically coupled to said implement and electrically coupled to said inhibit means for automatically interrupting the application of said electrical signal to said electronic switch means when said implement is raised off the ground to at least a predetermined angle with respect to the horizontal.

14. A system in accordance with claim 10, in which said presettable divider means comprises a plurality of series-connected decade dividers each having a plurality of decoded output terminals and a NAND gate having a plurality of input terminals corresponding to said plurality of series-connected decade dividers, with a corresponding plurality of selector switches respectively coupled between said decoded output terminals of said decade dividers and said NAND gate for selectively coupling one of said decoded output terminals of each divider to a input of said NAND gate, whereby the presettable divider may be set to adjust the system to accommodate various distance signal generating means.

15. A system in accordance with claim 10, in which said electronic switch means comprises a flip-flop circuit including two cross-coupled NAND gates.

16. A system in accordance with claim 10, in which said display means comprises an electromechanical counter responsive to said area signal for visually displaying a decimal number corresponding to the area measured by said system.

17. A system in accordance with claim 16, which further comprises indicator means responsive to the energization of said system by a suitable power source for indicating the proper decimal point in said decimal area display and indicating that the sytem is energized.

18. A system in accordance with claim 10, which further comprises decoder means coupled between said counter means and said display means for converting said area signal into a signal corresponding to a predetermined unit of area measurement.

19. A system in accordance with claim 18, in which said decoder means comprises a plurality of binary counters each having a plurality of parallel decoder output terminals, a diode array coupled to said decoder output terminals for developing a plurality of decoded signals each corresponding to a different predetermined unit of area measurement, and a selector switch coupled between said diode array and said display means, whereby the different units of area measurement may be selectively displayed by the display means.

* * * * *